United States Patent
Moy et al.

(10) Patent No.: US 7,203,262 B2
(45) Date of Patent: Apr. 10, 2007

(54) METHODS AND APPARATUS FOR SIGNAL MODIFICATION IN A FRACTIONAL-N PHASE LOCKED LOOP SYSTEM

(75) Inventors: Carol Moy, Morristown, NJ (US); Christine DiVincenzo, Califon, NJ (US); Eoin Carey, Cork (IE); Herbert Jaeger, Cork (IE); Robert Servilio, Washington, NJ (US)

(73) Assignees: M/A-Com, Inc., Lowell, MA (US); M/A-Com, Eurotec, B.V., Amsterdam (NL)

( * ) Notice: Subject to any disclaimer, the term of this patent is extended or adjusted under 35 U.S.C. 154(b) by 748 days.

(21) Appl. No.: 10/436,572

(22) Filed: May 13, 2003

(65) Prior Publication Data

US 2004/0228430 A1    Nov. 18, 2004

(51) Int. Cl.
*H03D 3/24* (2006.01)
(52) U.S. Cl. ....................................... 375/376
(58) Field of Classification Search ............... 375/376, 375/372, 374, 375; 332/127, 128; 331/17, 331/1 A; 327/147, 156
See application file for complete search history.

(56) References Cited

U.S. PATENT DOCUMENTS

| | | |
|---|---|---|
| 3,978,422 A | 8/1976 | Rheinfelder |
| 4,580,111 A | 4/1986 | Swanson |
| 4,586,000 A | 4/1986 | Wagner |
| 4,646,359 A | 2/1987 | Furrer |
| 5,278,997 A | 1/1994 | Martin |
| 5,311,143 A | 5/1994 | Soliday |
| 5,410,280 A | 4/1995 | Linguet et al. |
| 5,642,002 A | 6/1997 | Mekanik et al. |
| 5,774,017 A | 6/1998 | Adar |
| 5,818,298 A | 10/1998 | Dent et al. |
| 5,880,633 A | 3/1999 | Leizerovich et al. |
| 5,892,431 A | 4/1999 | Osterman |
| 5,930,128 A | 7/1999 | Dent |
| 5,939,951 A | 8/1999 | Bateman et al. |
| 5,942,946 A | 8/1999 | Su et al. |

(Continued)

FOREIGN PATENT DOCUMENTS

| | | |
|---|---|---|
| EP | 0 727 877 A2 | 8/1996 |
| WO | WO 01/10013 A1 | 2/2001 |

OTHER PUBLICATIONS

Hulick, "The Digital Linear Amplifier", Schwenksville, Pennsylvania.

(Continued)

*Primary Examiner*—Khai Tran

(57) ABSTRACT

A phase locked loop includes a buffer that synchronizes the transmission of the new count value to the completion of the previous count to avoid errors caused by dithering. The buffer is connected to a count input of the counter and transmits the new count upon receipt of the carryout signal from the counter. Alternatively, the transmission of the new value of N from the buffer is delayed after receipt by the buffer of a carryout signal from the counter. In another embodiment, a delayed version of the carryout signal is used to trigger the buffer to transmit the new count value to the counter. In another feature, a buffer synchronizes phase data to a reference signal before inputting it to a digital modulator of the phase locked loop.

38 Claims, 3 Drawing Sheets

U.S. PATENT DOCUMENTS

| | | | |
|---|---|---|---|
| 5,952,895 A | 9/1999 | McCune, Jr. et al. ........ 332/128 |
| 6,043,707 A | 3/2000 | Budnik | |
| 6,043,712 A | 3/2000 | Leizerovich et al. | |
| 6,075,413 A | 6/2000 | Katakura | |
| 6,078,628 A | 6/2000 | Griffith et al. | |
| 6,094,101 A | 7/2000 | Sander et al. ................. 331/17 |
| 6,097,252 A | 8/2000 | Sigmon et al. | |
| 6,101,224 A | 8/2000 | Lindoff et al. | |
| 6,107,843 A | 8/2000 | de Gouy et al. ............ 327/105 |
| 6,112,071 A | 8/2000 | McCune, Jr. | |
| 6,133,788 A | 10/2000 | Dent | |
| 6,140,875 A | 10/2000 | Van Den Homberg et al. | |
| 6,140,882 A | 10/2000 | Sander ........................ 331/25 |
| 6,147,553 A | 11/2000 | Kolanek | |
| 6,157,681 A | 12/2000 | Daniel et al. | |
| 6,191,653 B1 | 2/2001 | Camp, Jr. et al. | |
| 6,198,347 B1 | 3/2001 | Sander et al. | |
| 6,201,452 B1 | 3/2001 | Dent et al. | |
| 6,215,355 B1 | 4/2001 | Meck et al. | |
| 6,219,394 B1 | 4/2001 | Sander | |
| 6,236,284 B1 | 5/2001 | Duello et al. | |
| 6,242,975 B1 | 6/2001 | Eidson et al. | |
| 6,246,286 B1 | 6/2001 | Persson | |
| 6,255,906 B1 | 7/2001 | Eidson et al. | |
| 6,255,912 B1 | 7/2001 | Laub et al. .................... 331/25 |
| 6,259,901 B1 | 7/2001 | Shinomiya et al. | |
| 6,269,135 B1 | 7/2001 | Sander | |
| 6,285,251 B1 | 9/2001 | Dent et al. | |
| 6,288,916 B1 | 9/2001 | Liu et al. | |
| 6,294,938 B1* | 9/2001 | Coddington et al. ........ 327/158 |
| 6,294,957 B1 | 9/2001 | Luu | |
| 6,311,046 B1 | 10/2001 | Dent | |
| 6,317,608 B1 | 11/2001 | Glöcker | |
| 6,321,072 B1 | 11/2001 | Cipriani et al. | |
| 6,323,731 B1 | 11/2001 | McCune, Jr. | |
| 6,356,155 B1 | 3/2002 | Judkins | |
| 6,366,177 B1 | 4/2002 | McCune et al. | |
| 6,369,657 B2 | 4/2002 | Dening et al. | |
| 6,377,784 B2 | 4/2002 | McCune | |
| 6,380,802 B1 | 4/2002 | Pehike et al. | |
| 6,404,823 B1 | 6/2002 | Grange et al. | |
| 6,411,655 B1 | 6/2002 | Holden et al. | |
| 6,426,677 B1 | 7/2002 | Prentice | |
| 6,426,678 B1 | 7/2002 | Ko | |
| 6,430,402 B1 | 8/2002 | Agahi-Kesheh | |
| 6,445,247 B1 | 9/2002 | Walker | |
| 6,449,465 B1 | 9/2002 | Gailus et al. | |
| 6,515,553 B1* | 2/2003 | Filiol et al. .................. 332/127 |
| 6,518,845 B2* | 2/2003 | Nakamichi .................... 331/16 |
| 6,675,272 B2* | 1/2004 | Ware et al. ................. 711/167 |
| 6,707,855 B2* | 3/2004 | Patana ......................... 375/244 |
| 2002/0012412 A1 | 1/2002 | Maeda ........................ 375/376 |
| 2003/0031267 A1 | 2/2003 | Hietala ....................... 375/295 |
| 2003/0198311 A1* | 10/2003 | Song et al. ................. 375/376 |

OTHER PUBLICATIONS

Kozyrey, "Single-Ended Switching-Mode Tuned Power Amplifier with Filtering Circuit", Poluprovodnikovye pribory v teknike svyazi, 1971, pp. 152-166, vol. 6.

TimeStar™, "Multi-Mode Polar Modulator" 2002, Tropian Headquarters, USA.

Sundstrom, "Digital RF Power Amplifier Linearisers", 1995, Sweden.

Kenington, "Linearised RF Amplifier and Transmitter Techniques", Microwave Engineering Europe, Nov. 1998, pp. 35-.

Mann, et al., "Increasing Talk-Time with Effecient Linear PAs", Presented at IEE Colloquim on Tetra Market and Technology Developments, Feb. 2000, London.

Mann, et al., "Increasing the Talk-Time of Mobile Radios with Effecient Linear Transmitter Architectures", Electronics & Communication Engineering Journal, Apr. 2001, pp. 65-76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, pp. 131-133, vol. 35, No. 2.

Tropian-Products Main, www.tropian.com/products/, Copyright 2000-2001, Aug. 14, 2002.

"Tropian and Agilent Technologies announce collaboration on multi-band, multi-mode 2.5G transmitter solutions", Feb. 18, 2002, Connes, France.

"Tropian Awarded 8th U.S. Patent for Wireless Technology: Innovative RF Power Processing Circuit Architecture Acheives Speed and Accuracy in Polar Modulation,"Aug. 6, 201, Cupertino, California.

Dialog Web Command Mode, p. 1 of 1, Sep. 17, 2002, Record 03929207, Polar Modulators for 1 and 2 GHz Power Amplifier Connection, Nisbet, J.

Dialog Web Command Mode, p. 1 of 1, Sep. 17, 2002, Record 0326082, A new Class-AB Design, De Jager, et al., Electronics World 105, Dec. 1999, p. 982-7.

Dialog Web Command Mode, p. 1 of 1, Sep. 17, 2002, Record 2371235, Increasing the talk-time of mobile radios with efficient linear transmitter architectures, Mann et al., Electronics & Communication Engineering Journal, v. 13, No. 2, Apr. 2001 (p. 65-76).

Dialog Web Command Mode, p. 1 of 3, Sep. 17, 2002, Record 15595216, The big climate amplifier ocean circulation-sea-ice-storminess-dustiness-albedo, Broecker, Geophysical Monograph, 2001, 126, 53-56, etc.

Dialog Web Command Mode, p. 1 of 9, Sep. 19, 2002, Record 10872787, Out-of-band emissions of digital transmissions using Kahn EER Technique, Rudolph, IEEE Transactions on Microwave Theory & Techniques, 2002, V 50, N 8, Aug., p. 1979-1983, etc.

Dialog Web Command Mode, p. 1 of 20, Sep. 17, 2002. Record 01239474, GSM Players Eye Edge Despite Transmit Woes, Keenan, Electronic Engineering Times, 2002 n 1211, p. 6.

\* cited by examiner

METHODS AND APPARATUS FOR SIGNAL MODIFICATION IN A FRACTIONAL-N PHASE LOCKED LOOP SYSTEM

FIELD OF THE INVENTION

The invention relates generally to phase locked loop systems, and more particularly to signal modification in a fractional-N phase locked loop system.

BACKGROUND OF THE INVENTION

Phase locked loop systems, also known as phase locked loops, are used for a wide variety of purposes, such as frequency synthesizers and phase modulators in transceivers for wireless communications devices such as GSM (Global System for Mobile communications), PCS (Personal Communication System), PCN (Personal Communications Network), and DECT (Digital Enhanced Cordless Telecommunications) devices.

In a divide-by-N phase locked loop ("PLL"), a reference signal at a reference frequency is input to a phase/frequency detector along with a feedback signal derived from the output of the PLL. The output of the frequency/phase detector is connected to a charge pump. The filtered output of the charge pump is applied to a voltage controlled oscillator to generate an output signal at the desired frequency. The output signal frequency is divided by a value of N using a counter that functions as a frequency divider, the carryout signal of which forms the feedback signal input to the phase/frequency detector.

In a divide-by-N PLL, the output frequency cannot be varied in steps any smaller than the reference frequency. This limitation has led to the development of fractional-N phase locked loops. In a fractional-N phase locked loop, the value of N is changed over time so that changes in frequency in steps less than the reference frequency can be realized.

In this fractional-N type of PLL, it is desirable to synchronize the transmission to the counter of the new value of N with the completion of the previous count. However, it is also necessary to synchronize the generation of the new values of N with the reference frequency. Unfortunately, these two events are asynchronous. This leads to dithering between the completion of the previous count and the generation of the new value of N. This dithering may result in new values of N not being loaded into the counter and/or the same values of N being loaded into the counter twice. Either event can cause frequency and/or phase errors in the output of the voltage controlled oscillator.

What is needed is a technique to prevent errors in dithering. Additionally, when such a PLL is used as a digital phase modulator, it is necessary for the phase data to be synchronized to the reference frequency. If phase data is supplied to the PLL asynchronously, a technique for synchronizing the phase data to the reference frequency is also needed. Moreover, it would be helpful to have general techniques for modifying electromagnetic waves in phase locked loop devices as well as other similar devices to meet needs in the art.

SUMMARY OF THE INVENTION

The present invention meets the aforementioned needs to a great extent, through disclosing methods and apparatus for signal modification in a phase locked loop. For example, the preferred embodiments modify a signal in a phase locked loop by synchronizing an input to a divider in the phase locked loop to a carryout signal generated by the divider. Apparatus of the preferred embodiments comprise a phase/frequency detector, the phase/frequency having a first input and a second input, the first input being connectable to a reference signal; an oscillator for generating a desired output signal; a charge pump and a loop filter connected in series between the output of the phase/frequency detector and an input of the oscillator; a divider connected to receive the output signal generated by the oscillator, the divider having a count input and a carryout output, the carryout output being connected to the second input of the phase/frequency detector; and a buffer connected to supply a count signal to the count input of the divider under the control of the carryout output of the divider.

BRIEF DESCRIPTION OF THE DRAWINGS

A more complete appreciation of the invention and many of the attendant features and advantages thereof will be readily obtained as the same become better understood by reference to the following detailed description when considered in connection with the accompanying drawings, wherein.

DETAILED DESCRIPTION OF THE PREFERRED EMBODIMENTS

The present invention will be discussed with reference to preferred embodiments of the invention. The preferred embodiments discussed herein should not be understood to limit the invention. Furthermore, for ease of understanding, certain method steps are delineated as separate steps; however, these steps should not be construed as necessarily distinct nor order dependent in their performance.

Figure 1:
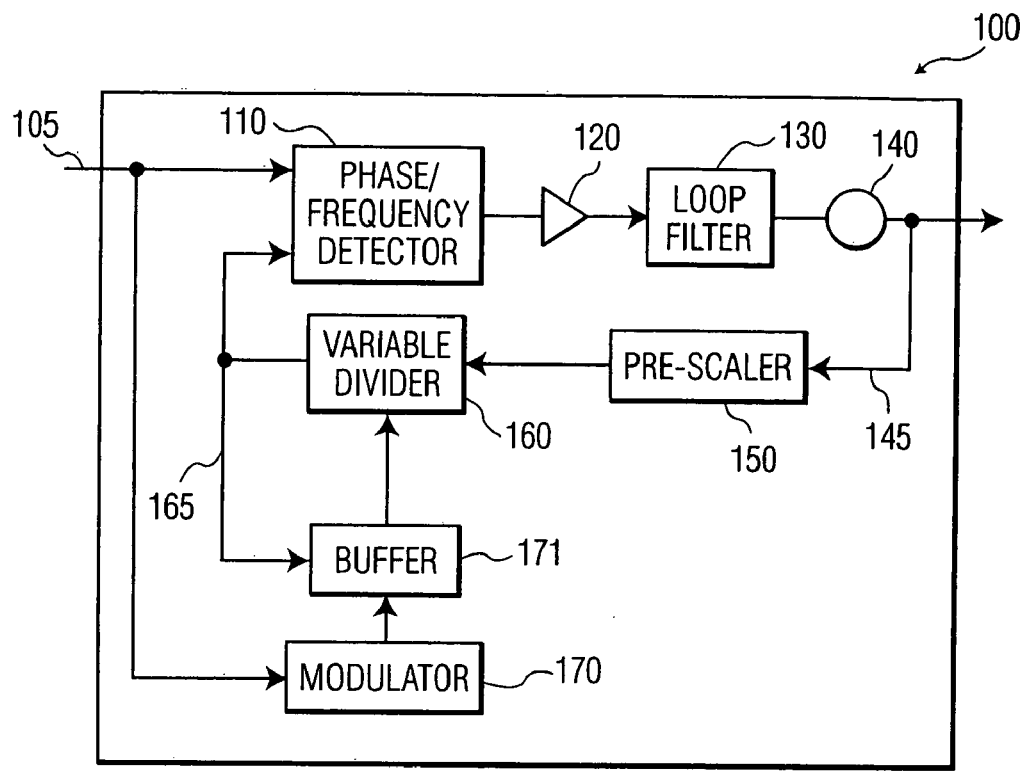
FIG. 1 is a block diagram of a fractional-N phase locked loop according to a first embodiment of the invention.

FIG. 1 illustrates a fractional-N PLL 100 according to an embodiment of the invention. A reference signal 105 at a reference frequency $f_{ref}$ is applied to one of the inputs of a phase/frequency detector 110. A second other input to the phase/frequency detector 110 is supplied by a carryout signal 165, at a frequency $f_1$, from variable divider 160, which comprises a programmable counter in preferred embodiments. The phase/frequency detector 110 compares both input frequencies $f_{ref}$ and $f_1$ and generates an output that is a measure of their phase difference. If there is a difference in frequency between the two signals input to the phase/frequency detector 110, the output of the phase/frequency detector 110 is a signal that vanes at the difference frequency.

The output of the phase/frequency detector 110 is connected to a charge pump 120. Charge pump 120 outputs current pulses whose width is proportional to the output of the phase/frequency detector. These current pulses are integrated and filtered by the loop filter 130 to provide a control voltage for the VCO 140. The output of the charge pump 120 is connected to a loop filter 130. The output of the loop filter 130 is connected to a voltage controlled oscillator (VCO) 140, which outputs a signal 145 at an output frequency proportional to the voltage supplied by loop filter 130. The output signal 145 of the VCO 140 is also connected to a pre-scaler 150. The pre-scaler 150 performs an initial frequency division of the VCO output signal 145. The output of the pre-scaler 150 is connected to the input of a variable divider 160. Thus, the value of N by which the frequency of VCO output signal 145 will be divided is determined by pre-scaler 150 and variable divider 160. The pre-scaler in this embodiment is fixed, but it should be noted that it may be desired in other embodiments to use a programmable pre-scaler.

It may be desired, in other embodiments, to realize a fractional-N PLL without a pre-scaler, and so establish a value of N by which the frequency of a VCO output signal will be divided through a variable divider. However, in certain power-critical applications, such as wireless communication device transceivers, the use of a pre-scaler can result in a power savings, among other uses. In yet other applications a pre-scaler embodiment might compensate for possible environments, such as when a desired output signal, e.g. 145, may be at a frequency that is higher than that at which a variable divider, e.g., 160, is capable of functioning.

Returning now to the embodiment of FIG. 1, variable divider 160 is typically a counter, which counts to a value N received from buffer 171. Buffer 171 accepts new count values N from the modulator 170 and stores them until the carryout signal 165 is received from the variable divider 160. When the buffer 171 detects the carryout signal 165, the new value of N is transmitted from the buffer 171 to the variable divider 160. Thus, the new value of N will not be transmitted to the variable divider 160 prior to the completion of the previous count.

When the count of the variable divider 160 reaches N, the carryout signal 165 is generated. The carryout signal, is input to the phase/frequency detector 170, and also fed back to the reset input of variable divider 160 so that it resets and inputs a next value count value N from the buffer 171. The phase/frequency detector 110 measures a difference in frequency between the carryout signal 165 and the reference signal 105.

The modulator 170 generates an output signal comprising a succession of values N such that the long term average of the values N results in a desired frequency and/or phase in the output 145 of the VCO 140. A sigma delta modulator (SDM) may be used for this purpose. In highly preferred embodiments, the SDM is a digital third order SDM with a three bit output, which implies that the count variable N output by the SDM varies between $2^3=8$ values.

The reference signal 105 is also input to modulator 170 such that the new values of N in the output of the modulator 170 are synchronized to the reference signal 105.

Buffer 171 acts to some extent as a delay, and in other embodiments may incorporate a dedicated delay element as well. In yet other embodiments, as further described below, a discrete delay element may be used.

Figure 2:
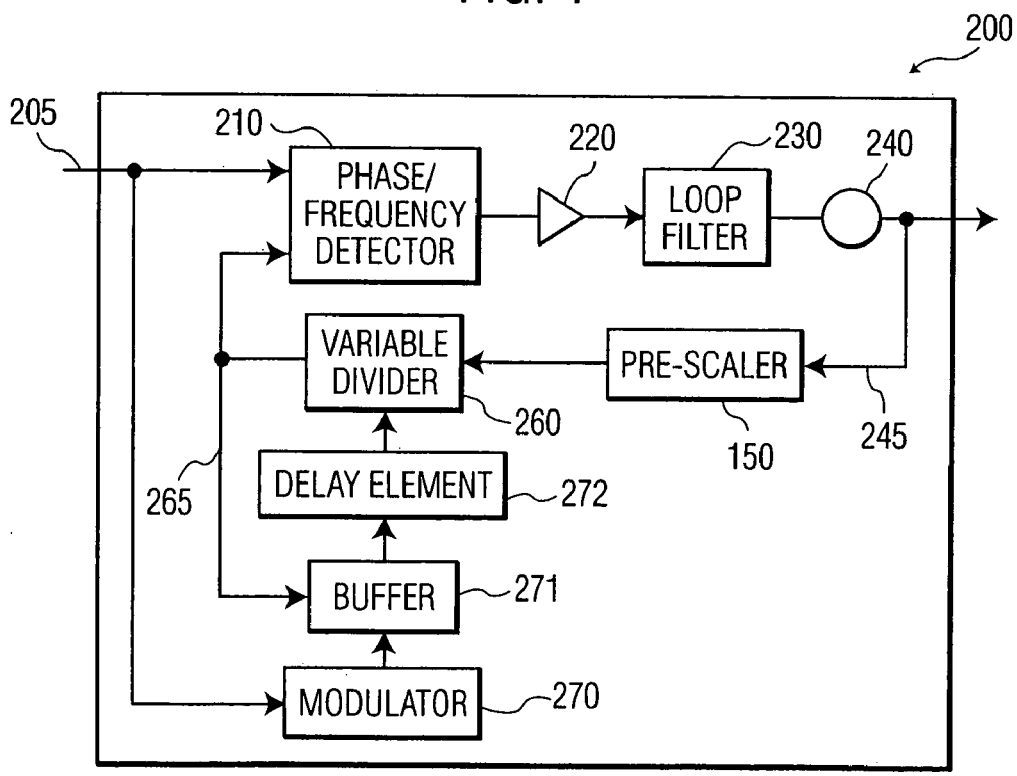
FIG. 2 is a block diagram of a fractional-N phase locked loop according to a second embodiment of the invention.

FIG. 2 illustrates a PLL 200 according to another embodiment of the invention. The PLL 200 is similar to the PLL 100, of FIG. 1, with a discrete delay element 272 added between the buffer 271 and the variable divider 260. The delay element can be any circuit (e.g., appropriately clocked data flip flops) that will add a delay between the time the carryout signal 265 is generated and the time when the new count value N reaches the variable divider.

The delay element 272 is shown in FIG. 2 as an addition to the buffer 271. However, the delay introduced by a delay element may also be used in place of a buffer in some embodiments. In those embodiments, the output of a modulator is connected to an input of the delay element. A maximum expected dither is determined and the delay introduced by delay element is chosen to exceed the maximum expected dither. It should be understood that a delay element may be physically separate from or may be incorporated into a modulator.

Figure 3:
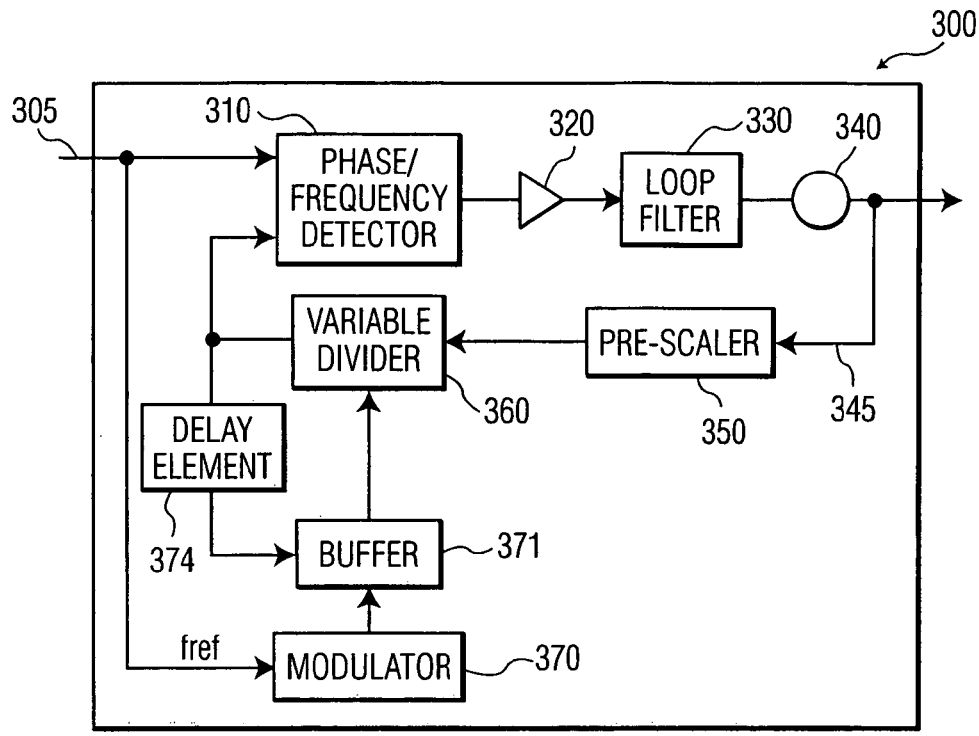
FIG. 3 is a block diagram of a digital phase modulator incorporating a fractional-N phase locked loop according to a third embodiment of the invention.

A PLL 300 according to a third embodiment of the invention is illustrated in FIG. 3. The PLL 300 is similar to the PLL 100, of FIG. 1, with the exception that a delay element 374 has been added between the carryout output of the variable divider 360 and the buffer 371. The delay element 374 of FIG. 3 achieves the same result as the delay element 272 of FIG. 2—it delays the time between the generation of the carryout signal from the variable divider 360 and the transmission of the new count N to variable divider 360 to guard against dithering problems. The delay element 374 of FIG. 3 accomplishes this result by delaying the receipt of the carryout signal at the buffer 371 rather than delaying the output of the buffer 371. The delay element 374 may be accomplished by any number of circuits (e.g., an appropriately clocked data flip flop). Delay element 374 may be physically separated from or incorporated into buffer 371.

If desired, in yet other embodiments, a delay element similar to delay element 374 of FIG. 3 may be used in place of or in addition to a delay element similar to delay element 272 of FIG. 2.

Figure 4:
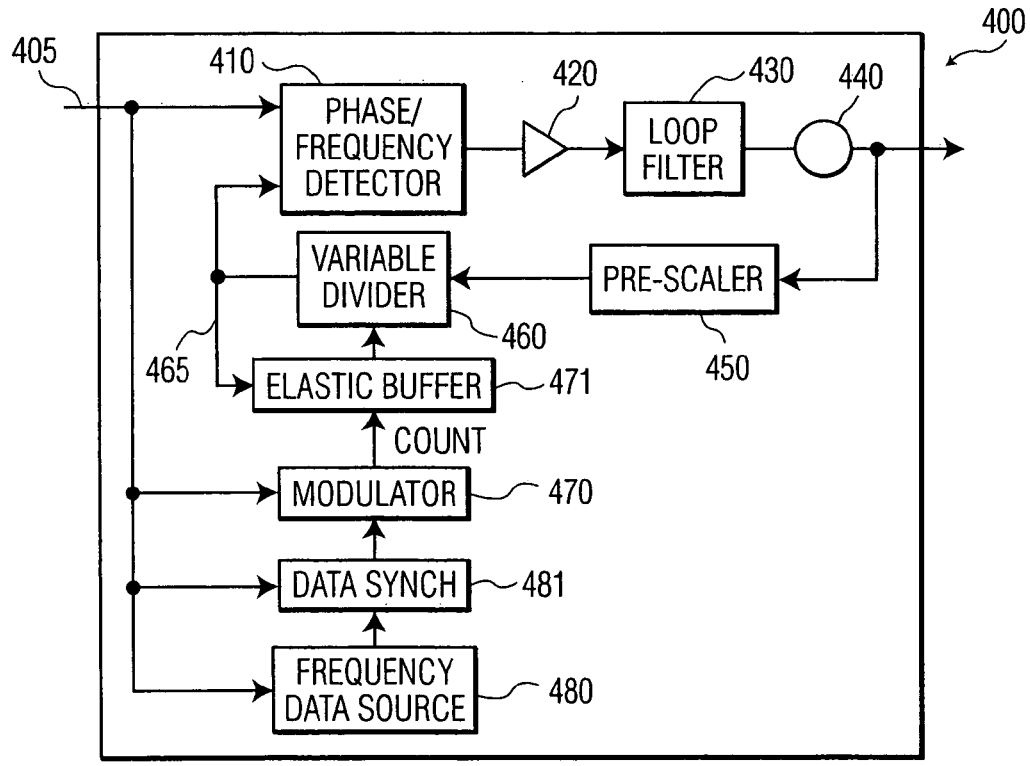
FIG. 4 is a block diagram of a digital phase modulator incorporating a fractional-N phase locked loop according to a fourth embodiment of the invention.

A PLL 400 according to a fourth embodiment of the invention is illustrated in FIG. 4. The PLL 400 of FIG. 4 is believed to be particularly applicable to PLLs used in phase modulators and therefore is so illustrated in FIG. 4 and discussed in that context below. However, this embodiment of the invention should not be understood to be limited to phase modulators.

The PLL 400 is similar to the PLL 100 of FIG. 1. A frequency data source 480 and a data synch 481 have been added. In this embodiment, the data from frequency data source 480 is clocked at a different frequency than the reference frequency. Providing different rates for the source and reference frequencies allows for more flexibility in each part of the embodiment, so that, for example, the various components may be optimized independently of one another as the same data rate for each need not be chosen.

The frequency data source 480 can be of any type, including, but not limited to, a digital signal processor. The frequency data source 480 supplies data to the PLL 400. Frequency data source 480 is connected to an input of data synchronizer 481. A second input of data synchronizer 481 is connected to the reference signal $f_{ref}$ 405. The output of data synchronizer 481 is connected to the modulator 470. Data synchronizer 481 synchronizes the input of phase data to the modulator 470. As will be appreciated by those of skill in the art, the data synchronizer may be a buffer, a bank of data flip flops, a register, or any other circuit capable of performing this function. These embodiments and variants may be desired when the frequency data source 480 is clocked at a different frequency than the reference frequency or located remotely.

Embodiments may be used in wideband modulators, such as those appropriate for applications including, but not limited to, transceivers for cell phones, e.g., CDMA, CDMA2000, W-CDMA, GSM, TDMA, and the various types of digital modulation techniques used therein, such as GMSK used in GSM, GFSK used in DECT and Bluetooth, 8-PSK used in EDGE, OQPSK and HPSK used in IS-2000, π/4 DQPSK used in TDMA and OFDM used in 802.11.; as well as, other types of devices, both wired and wireless, e.g. Bluetooth, 802.11a, -b, -g, GPS, radar, 1xRTT, radios, GPRS, computers and computer communication devices, handheld devices, etc.

Figure 5:
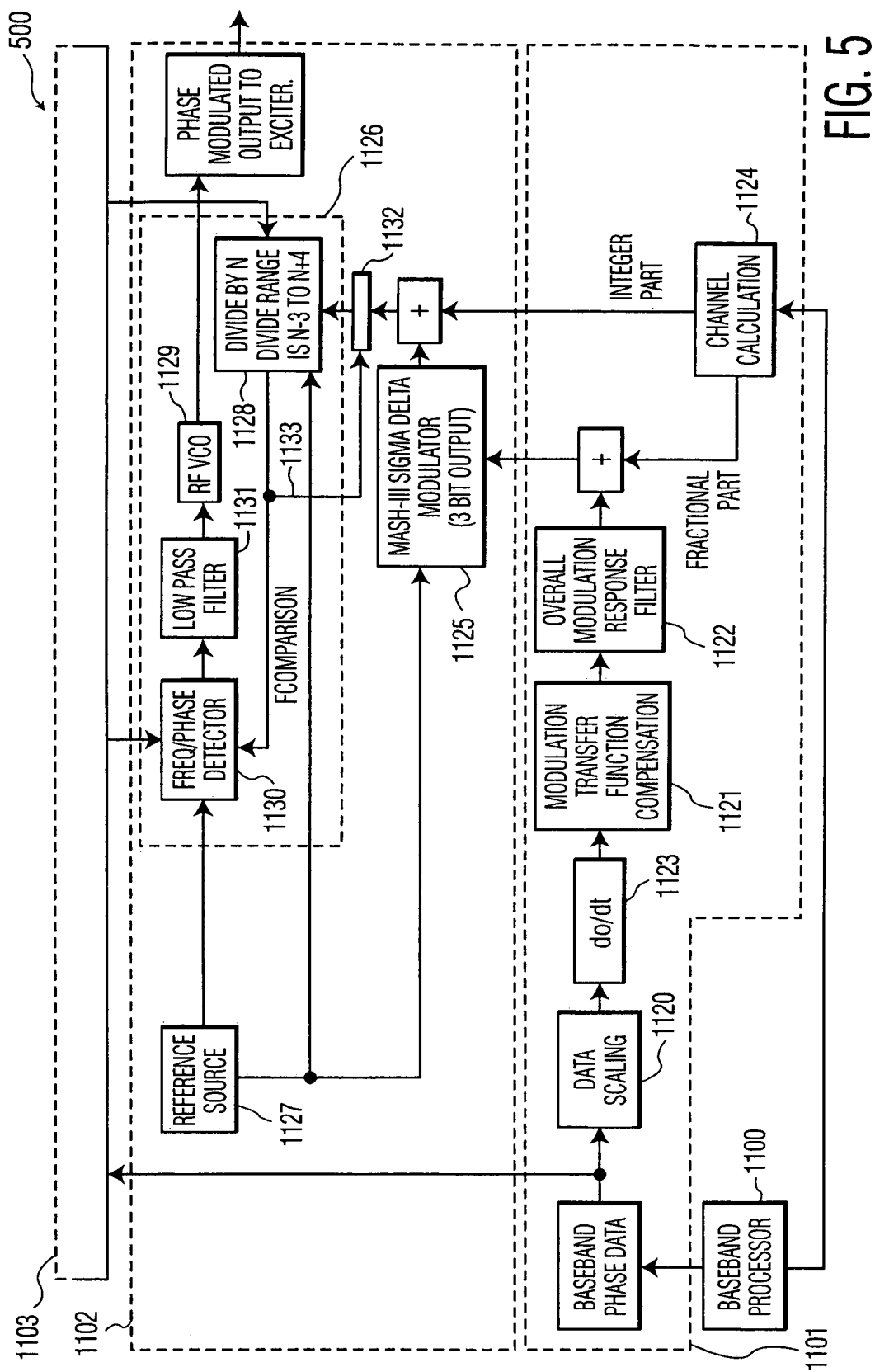
FIG. 5 is a block diagram of a wideband modulator incorporating a fractional-N phase locked loop according to a fifth embodiment of the invention.

FIG. 5 illustrates an embodiment that may be desirable for use in a cellular phone transceiver. A portion 500 of a transceiver includes three sections: an amplitude/phase signal processor 1101, a wideband modulator 1102, and an adaptive phase realignment circuit 1103.

The wideband modulator 1102 comprises a phase locked loop 1126 (comprising a phase/frequency detector 1130, a low pass filter 1131, a voltage controlled oscillator 1129, and a variable divider 1128), a reference source 1127, and a third-order SDM 1125. The input to the variable divider 1128 of the PLL 1126 is connected to a buffer 1132, which is controlled by the carryout signal 1133 from the variable divider 1128 to input new count data to the variable divider 1128. The new count data input to the buffer 1132 comprises a summed integer part corresponding to a desired channel received from amplitude and phase signal processor 1101 (which in turn is received via baseband processor 1100) and fractional part from the SDM 1125. The SDM 1125 is driven by a signal from the amplitude and phase signal processor 1101 based upon the desired channel and desired phase modulation, which is received from data scaler 1120, differentiator 1123, modulation compensation (equalization) filter 1121, and overall modulation response filter 1122.

It should also be noted that, in addition to or in place of the buffer 1132, a delay element may be connected to the new count input of the divider 1128 to delay transmission of the count signal from a count source in a manner similar to the embodiment described above (see, e.g., FIG. 2. Alternatively, a delay element may be connected to the carryout output of the divider 1128 to delay receipt of the carryout signal to a count source in a manner similar to the embodiments discussed above (see, e.g. FIG. 3.)

Embodiments may utilize both analog and digital components, where desired, insofar as these embodiments manipulate waves and signals requiring both. For example, cell phone embodiments may utilize both analog and digital components. Various types of technologies may also be utilized for constructing various embodiments. For example, embodiments or various components may be provided on a semiconductor device where desired, such as an integrated circuit or an application-specific integrated circuit composition; some examples include silicon (Si), silicon germanium (SiGe) or gallium arsenide (GaAs) substrates.

Obviously, numerous modifications and variations of the present invention are possible in light of the above teachings. It is therefore to be understood that within the scope of the appended claims, the invention may be practiced otherwise than as specifically described herein.

What is claimed is:

1. A method for modification in a phase locked loop comprising:
   synchronizing an input to a divider in the phase locked loop to a carryout signal generated by the divider, wherein synchronizing comprises:
      transmitting the carryout signal to a buffer; and
      in the buffer, detecting the carryout signal and transmitting the input to the divider,
   wherein the input is transmitted to the divider only after the buffer detects the carryout signal.

2. The method of claim 1, wherein the divider comprises a variable divider.

3. The method of claim 1, wherein the phase locked loop comprises a fractional-N phase locked loop.

4. The method of claim 1, wherein the input is supplied by a modulator.

5. The method of claim 4, wherein the modulator comprises a digital modulator.

6. The method of claim 5, wherein the digital modulator comprises a sigma-delta modulator.

7. The method of claim 1, wherein synchronizing further comprises storing the input to the divider in the buffer until the carryout signal is generated.

8. The method of claim 7, wherein the buffer comprises an elastic buffer.

9. The method of claim 7, further comprising delaying an output of the buffer for a period of time after the carryout signal is generated.

10. The method of claim 7, further comprising delaying transmission of the carryout signal to the buffer.

11. The method of claim 1, further comprising:
   temporarily storing phase data, the phase data being generated asynchronously with respect to a reference signal of the phase locked loop;
   transmitting the phase data from a data synchronizer to a modulator synchronously with respect to the reference signal, the modulator being configured to supply a new count value to the divider.

12. A method for modification in a phase locked loop comprising:
   in a divider, generating and transmitting an output to a device;
   in the device, detecting the output and transmitting an input to the divider;
   delaying receipt of the input to the divider in the phase locked loop, the input comprising a new count value to be used by the divider.

13. The method of claim 12, wherein the divider is a variable divider.

14. The method of claim 12, wherein the phase locked loop is a fractional-N phase locked loop.

15. The method of claim 12, wherein delaying comprises disposing a delay element between the divider and the device from which the input is received.

16. The method of claim 15, wherein the delay element is connected to a new count input to the divider.

17. The method of claim 15, wherein the delay element is connected to a carryout output of the divider.

18. A phase locked loop comprising:
   a phase/frequency detector, the phase/frequency having a first input and a second input, the first input being connectable to a reference signal;
   an oscillator for generating a desired output signal;
   a charge pump and a ioop filter connected in series between the output of the phase/frequency detector and an input of the oscillator;
   a divider connected to receive the output signal generated by the oscillator, the divider having a count input and a carryout output, the carryout output being connected to the second input of the phase/frequency detector; and
   a buffer connected to supply a count signal to the count input of the divider and to receive a carryout signal from the divider.

19. The phase locked loop of claim 18, further comprising a pre-scaler connected between the oscillator and the divider.

20. The phase locked loop of claim 19, wherein the pre-scaler comprises a programmable pre-scaler.

21. The phase locked loop of claim 18, wherein the oscillator comprises a voltage controlled oscillator.

22. The phase locked loop of claim 18, further comprising a modulator connected to the buffer.

23. The phase locked loop of claim 22, wherein the modulator comprises a sigma-delta modulator.

24. The phase locked loop of claim 22, wherein the modulator comprises a digital modulator.

25. The phase locked loop of claim 18, further comprising a delay element connected between the carryout output of the divider and the buffer.

26. The phase locked loop of claim 18, further comprising a delay input connected between the count input of the divider and the buffer.

27. The phase locked loop of claim 22, further comprising:
   a phase data source, the phase data source generating phase data asynchronously with respect to the reference signal; and
   a data synchronizer being connected to accept phase data from the phase data source and being connectable to the reference signal, the data synchronizer being configured to transmit the phase data to a digital modulator synchronously with respect to the reference signal.

28. A phase locked loop comprising:
   a phase/frequency detector, the phase/frequency having a first input and a second input, the first input being connectable to a reference signal;
   an oscillator for generating a desired output signal;
   a charge pump and a loop filter connected in series between the output of the phase/frequency detector and an input of the oscillator;
   a divider connected to receive the output signal generated by the oscillator, the divider having a count input and a carryout output, the carryout output being connected to the second input of the phase/frequency detector and to a count source;
   the count source being connected to supply a count signal to the count input of the divider and to receive a carryout signal from the divider; and
   a delay element connected between the count source and the divider.

29. The phase locked loop of claim 28, wherein the delay element is connected to the carryout output of the divider.

30. The phase locked loop of claim 28, wherein the delay element is connected to the count input of the divider.

31. The phase locked loop of claim 28, wherein the count source comprises a buffer.

32. The phase locked loop of claim 28, wherein the count source comprises a digital modulator.

33. The phase locked loop of claim 28, wherein an input of the charge pump is connected to an output of the phase/frequency detector, an output of the charge pump is connected to an input of the loop filter, and an output of the loop filter is connected to an input of the oscillator.

34. A method for synchronizing input of phase data to a phase modulator including a phase locked loop comprising:
   temporarily storing phase data in a data synchronizer, the phase data being asynchronous with respect to a reference signal of the phase locked loop;
   transmitting the phase data from the data synchronizer to a modulator synchronously with respect to the reference signal, the modulator being connected to supply a new count value to a variable divider of the phase locked loop.

35. The method of claim 34, wherein data synchronizer comprises a buffer.

36. The method of claim 35, further comprising the step of synchronizing an output of the modulator to the divider to a carryout signal generated by the divider.

37. A phase locked loop comprising:
   a phase/frequency detector, the phase/frequency having a first input and a second input, the first input being connectable to a reference signal;
   an oscillator for generating a desired output signal;
   a charge pump and a loop filter connected in series between the output of the phase/frequency detector and an input of the oscillator;
   a divider connected to receive the output signal generated by the oscillator, the divider having a count input and a carryout output, the carryout output being connected to the second input of the phase/frequency detector and to a count source;
   a modulator connected to the divider;
   a phase data source, the phase data source being configured to generate phase data asynchronously with respect to the reference signal; and
   a data synchronizer having an output connected to the modulator, a first input connected to an output of the phase data source for accepting phase data, and a second input being connected to receive the reference signal, the data synchronizer being configured to transmit the phase data to the modulator synchronously with respect to the reference signal.

38. The phase locked loop of claim 37, further comprising a buffer connected between the count input of the divider and the output of the modulator, the buffer being configured to output a count value received from the modulator under the control of the carryout output of the divider.

* * * * *